(12) United States Patent
Mathur et al.

(10) Patent No.: US 9,123,802 B2
(45) Date of Patent: Sep. 1, 2015

(54) VERTICAL TRENCH MOSFET DEVICE IN INTEGRATED POWER TECHNOLOGIES

(71) Applicant: Texas Instruments Incorporated, Dallas, TX (US)

(72) Inventors: Guru Mathur, Plano, TX (US); Marie Denison, Plano, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/044,926

(22) Filed: Oct. 3, 2013

(65) Prior Publication Data

US 2015/0097231 A1   Apr. 9, 2015

(51) Int. Cl.
*H01L 29/792* (2006.01)
*H01L 29/76* (2006.01)
*H01L 29/94* (2006.01)
*H01L 31/062* (2012.01)
*H01L 31/113* (2006.01)
*H01L 29/78* (2006.01)
*H01L 29/66* (2006.01)
*H01L 29/10* (2006.01)
*H01L 29/08* (2006.01)

(52) U.S. Cl.
CPC ........ *H01L 29/7813* (2013.01); *H01L 29/0882* (2013.01); *H01L 29/1095* (2013.01); *H01L 29/66734* (2013.01)

(58) Field of Classification Search
CPC ....... H01L 29/792; H01L 29/76; H01L 29/94; H01L 31/113; H01L 31/119
USPC .................. 257/330, 341, E29.257; 438/286
See application file for complete search history.

(56) References Cited

U.S. PATENT DOCUMENTS

2013/0307062 A1* 11/2013 Meiser et al. ................. 257/330
2014/0077342 A1* 3/2014 He et al. ....................... 257/629

* cited by examiner

*Primary Examiner* — Phuc Dang
(74) *Attorney, Agent, or Firm* — Jacqueline J. Garner; Frank D. Cimino

(57) ABSTRACT

A semiconductor device having a vertical drain extended MOS transistor may be formed by forming deep trench structures to define at least one vertical drift region bounded on at least two opposite sides by the deep trench structures. The deep trench structures include dielectric liners. The deep trench structures are spaced so as to form RESURF regions for the drift region. Vertical gates are formed in vertically oriented gate trenches in the dielectric liners of the deep trench structures, abutting the vertical drift regions. A body implant mask for implanting dopants for the transistor body is also used as an etch mask for forming the vertically oriented gate trenches in the dielectric liners.

17 Claims, 11 Drawing Sheets

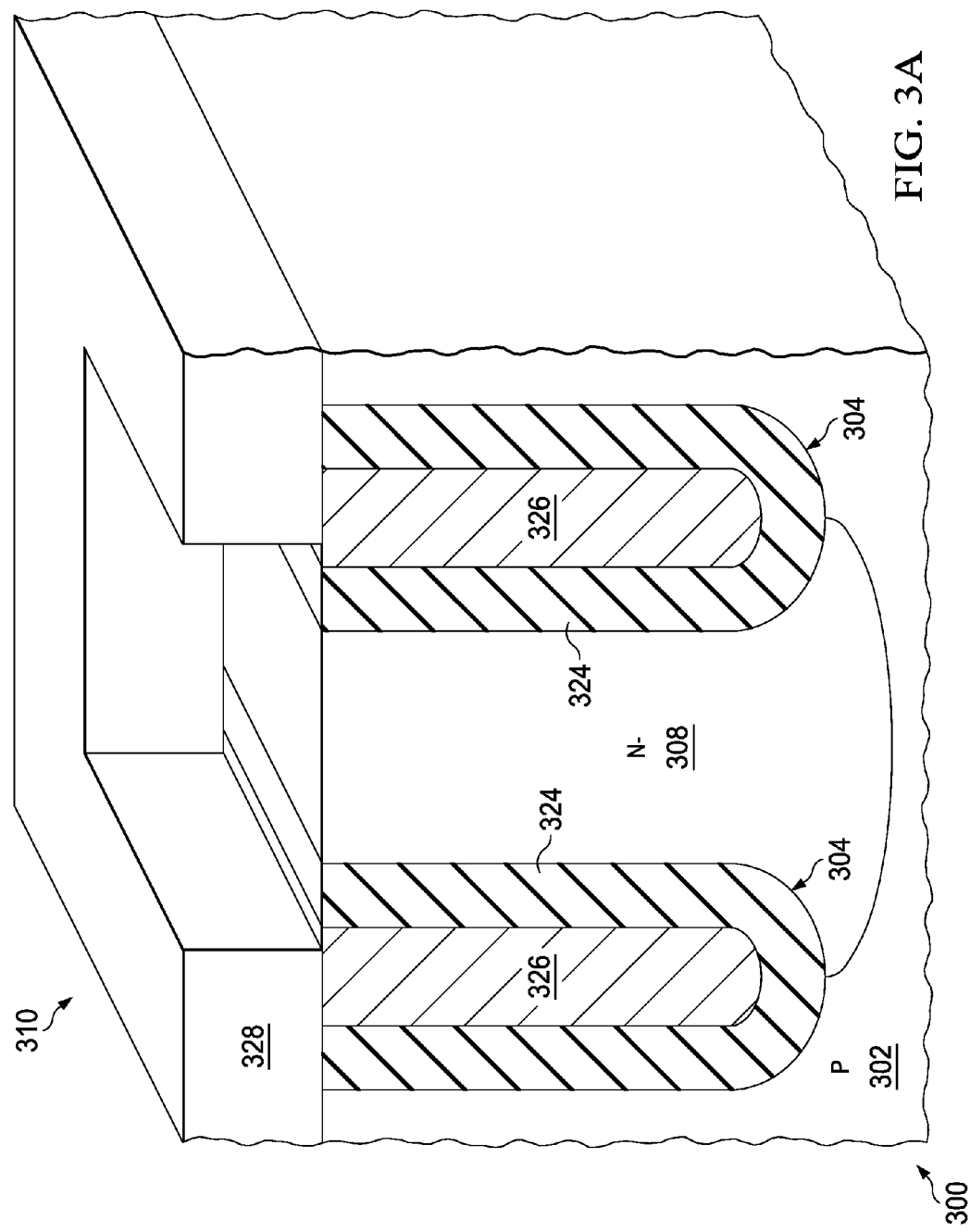

US 9,123,802 B2

VERTICAL TRENCH MOSFET DEVICE IN INTEGRATED POWER TECHNOLOGIES

FIELD OF THE INVENTION

This invention relates to the field of semiconductor devices. More particularly, this invention relates to drain extended transistors in semiconductor devices.

BACKGROUND OF THE INVENTION

An extended drain metal oxide semiconductor (MOS) transistor may be characterized by the resistance of the transistor in the on state, the lateral area which the transistor occupies at the top surface of the substrate containing the transistor, and the breakdown potential between the drain node and the source node of the transistor which limits the maximum operating potential of the transistor. It may be desirable to reduce the area of the transistor for given values of the on-state resistance and the breakdown potential. One technique to reduce the area is to configure the drift region in the extended drain in a vertical orientation, so that drain current in the drift region flows perpendicularly to the top surface of the substrate. Integrating a vertically oriented drift region in a semiconductor device using planar processing while maintaining desired fabrication cost and complexity may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device having a vertical drain extended MOS transistor may be formed by forming deep trench structures to define at least one vertical drift region of the transistor. The deep trench structures include dielectric liners. The vertical drift regions are bounded on at least two opposite sides by the deep trench structures. The deep trench structures are spaced so as to form RESURF regions for the drift region. Vertical gates are formed in trenches in the dielectric liners of the deep trench structures, abutting the vertical drift regions. A body implant mask for implanting dopants for the transistor body is also used as an etch mask for forming the trenches in the dielectric liners.

DESCRIPTION OF THE VIEWS OF THE DRAWING

FIG. 3A through FIG. 3G are cross sections of a semiconductor device, for example as depicted in FIG. 1 or FIG. 2, depicted in successive stages of fabrication.

DETAILED DESCRIPTION OF EXAMPLE EMBODIMENTS

Figure 1:
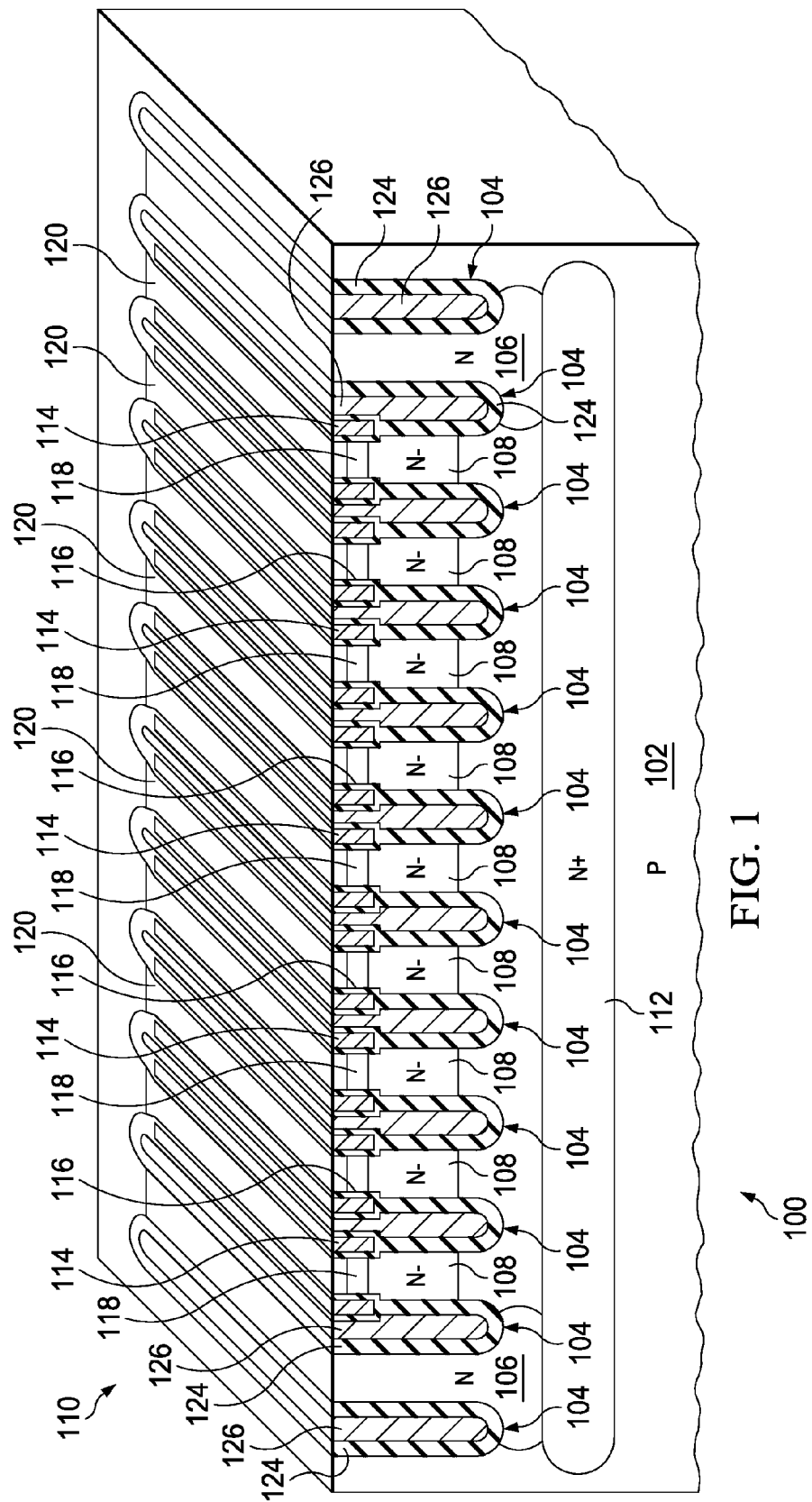
FIG. 1 is a cross section of a semiconductor device having a vertical drain extended MOS transistor.

The following co-pending patent applications contain related matter and are incorporated by reference: U.S. patent application Ser. No. 14/044,909 entitled "TRENCH GATE TRENCH FIELD PLATE SEMI-VERTICAL SEMI-LATERAL MOSFET;" and U.S. patent application Ser. No. 14/044,915 entitled "TRENCH GATE TRENCH FIELD PLATE VERTICAL MOSFET."

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device having a vertical drain extended MOS transistor may be formed by forming deep trench structures to define at least one vertical drift region of the transistor. The deep trench structures include dielectric liners. The vertical drift regions are bounded on at least two opposite sides by said deep trench structures. The deep trench structures are spaced so as to form RESURF regions for the drift region. Vertical gates are formed in trenches in the dielectric liners of the deep trench structures, abutting the vertical drift regions. A body implant mask for implanting dopants for a body region of the transistor is also used as an etch mask for forming the vertically oriented gate trenches in the dielectric liners. An optional buried drain contact layer may connect to the vertical drift regions to provide drain connections, or vertical drain contact regions which are adjacent to the vertical drift regions may provide drain connections. The semiconductor device may be, in one example, an integrated circuit containing the vertical drain extended MOS transistor and other transistors. The semiconductor device may be, in another example, a discrete device in which the vertical drain extended MOS transistor is the only transistor. A vertical drain contact region may possibly be disposed between adjacent portions of the deep trench structures.

For the purposes of this description, the term "RESURF" will be understood to refer to a material which reduces an electric field in an adjacent semiconductor region. A RESURF region may be for example a semiconductor region with an opposite conductivity type from the adjacent semiconductor region. RESURF structures are described in Appels, et. al., "Thin Layer High Voltage Devices" Philips J, Res. 35 1-13, 1980.

The examples described in this disclosure describe n-channel devices. It will be recognized that corresponding p-channel devices may be formed by appropriate changes in doping polarities. FIG. 1 is a cross section of a semiconductor device having a vertical drain extended MOS transistor. The semiconductor device 100 is formed in and on a p-type semiconductor substrate 102. The vertical drain extended MOS transistor 110 includes a plurality of deep trench structures 104 disposed in the substrate 102 so as to define at least one n-type vertical drain contact region 106 and a plurality of adjacent n-type vertically oriented drift regions 108 separated by instances of the deep trench structures 104. In the instant example, some instances of the deep trench structures 104 separating the vertically oriented drift regions 108 may have a linear configuration, as depicted in FIG. 1; a linear configuration does not have a closed loop topology. The at least one vertical drain contact region 106 and the vertically oriented drift regions 108 contact an n-type buried layer 112 disposed in the substrate 102.

The deep trench structures 104 are 1 to 5 microns deep, and 0.5 to 1.5 microns wide. The deep trench structures 104 are all substantially equal in depth. The deep trench structures 104 have dielectric liners 124 and may have optional electrically conductive central members 126. The vertically oriented drift regions 108 are bounded on at least two opposite sides by the deep trench structures 104, which are spaced 0.5 to 2 microns apart so as to provide RESURF regions for the vertically oriented drift regions 108. The vertical drain contact regions 106 are bounded on at least two opposite sides by the deep trench structures 104, which may be spaced, for example, 0.5 to 2.5 microns apart.

Vertical gates 114 and corresponding gate dielectric layers 116 are disposed in trenches in the dielectric liners 124 of the deep trench structures 104. In the instant example, the vertical gates 114 do not extend laterally into curved portions of the dielectric liners 124. At least one p-type body region 118 is disposed in the substrate 102 over the vertically oriented drift regions 108 and contacting the gate dielectric layers 116. The vertical gates 114 extend below the body regions 118 to the vertically oriented drift regions 108. N-type source regions 120 are disposed in the substrate 102 contacting the p-type body region 118 and the gate dielectric layers 116. Optional p-type body contact regions may be disposed in the substrate 102 contacting the body region 118.

The depth of the deep trench structures 104 may be adjusted to provide a desired operation voltage for the vertical drain extended MOS transistor 110. For example, deep trench structures 104 which are 2.5 microns deep may provide 30 volt operation. Deep trench structures 104 which are 4 microns deep may provide 50 volt operation. During operation of the vertical drain extended MOS transistor 110, the electrically conductive central members 126, if present, may be electrically biased to reduce a peak electric field in the vertically oriented drift regions 108. For example, the electrically conductive central members 126 may be connected to source regions 120, to the vertical gates 114 or to a bias source having a desired potential. Configuring the vertical drain extended MOS transistor 110 in a parallel plurality of the vertically oriented drift regions 108 having the vertical gates 114 in each dielectric liner 124 of the deep trench structures 104 abutting the vertically oriented drift regions 108 may provide a desired value of specific resistivity, that is a product of on-state resistance and transistor area, for the vertical drain extended MOS transistor 110.

Figure 2:
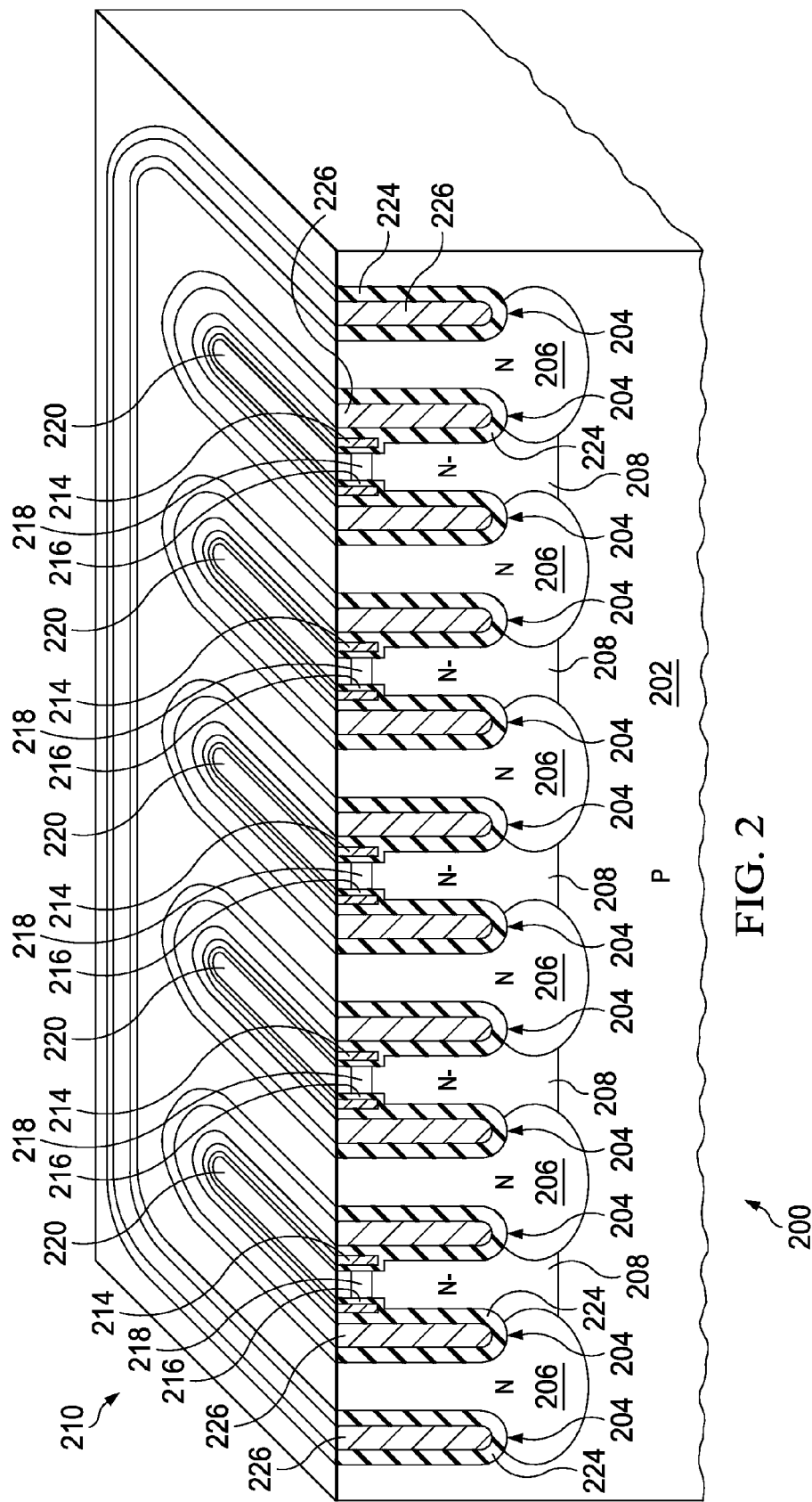
FIG. 2 is a cross section of a semiconductor device having a vertical drain extended MOS transistor.

FIG. 2 is a cross section of a semiconductor device having a vertical drain extended MOS transistor. The semiconductor device 200 is formed in and on a p-type semiconductor substrate 202. The vertical drain extended MOS transistor 210 has deep trench structures 204 disposed in the substrate 202; the deep trench structures 204 have dielectric liners 224 and optional electrically conductive central members 226. The deep trench structures 204 define at least one vertical drain contact region 206 by bounding the vertical drain contact regions 206 on at least two opposite sides, and surround at least one vertically oriented drift region 208 adjacent to the vertical drain contact region 206. The deep trench structures 204 provide RESURF regions for the vertically oriented drift regions 208. Each vertically oriented drift region 208 is adjacent to two deep trench structures 204, as depicted in FIG. 2. The vertical drain contact regions 206 are n-type and extends below bottoms of the deep trench structures 204, to make electrical connection to the vertical drain contact region 206 proximate to the bottoms of the deep trench structures 204. A deep trench structure 204 may surround the vertical drain extended MOS transistor 210 as depicted in FIG. 2. The deep trench structures 204 have the same depths and spacings as described in reference to FIG. 1.

Vertical gates 214 and corresponding gate dielectric layers 216 are disposed in trenches in the dielectric liners 224 of the deep trench structures 204. In the instant example, the vertical gates 214 extend laterally into curved portions of the dielectric liners 224 so as to laterally surround the vertically oriented drift regions 208 as depicted in FIG. 2. P-type body regions 218 are disposed in the substrate 202 over the vertically oriented drift regions 208 and contacting the gate dielectric layers 216. The vertical gates 214 extend below the body regions 218 to the vertically oriented drift regions 208. N-type source regions 220 are disposed in the substrate 202 contacting the p-type body region 218 and the gate dielectric layers 216.

Operation of the vertical drain extended MOS transistor 210 is similar to that described in reference to FIG. 1. Configuring the vertical drain extended MOS transistor 210 so that the deep trench structures 204 surround the vertically oriented drift regions 208 and so that the vertical gates 214 extend laterally around the vertically oriented drift regions 208 may provide a desired value of specific resistivity for the vertical drain extended MOS transistor 210.

Figure 3B:
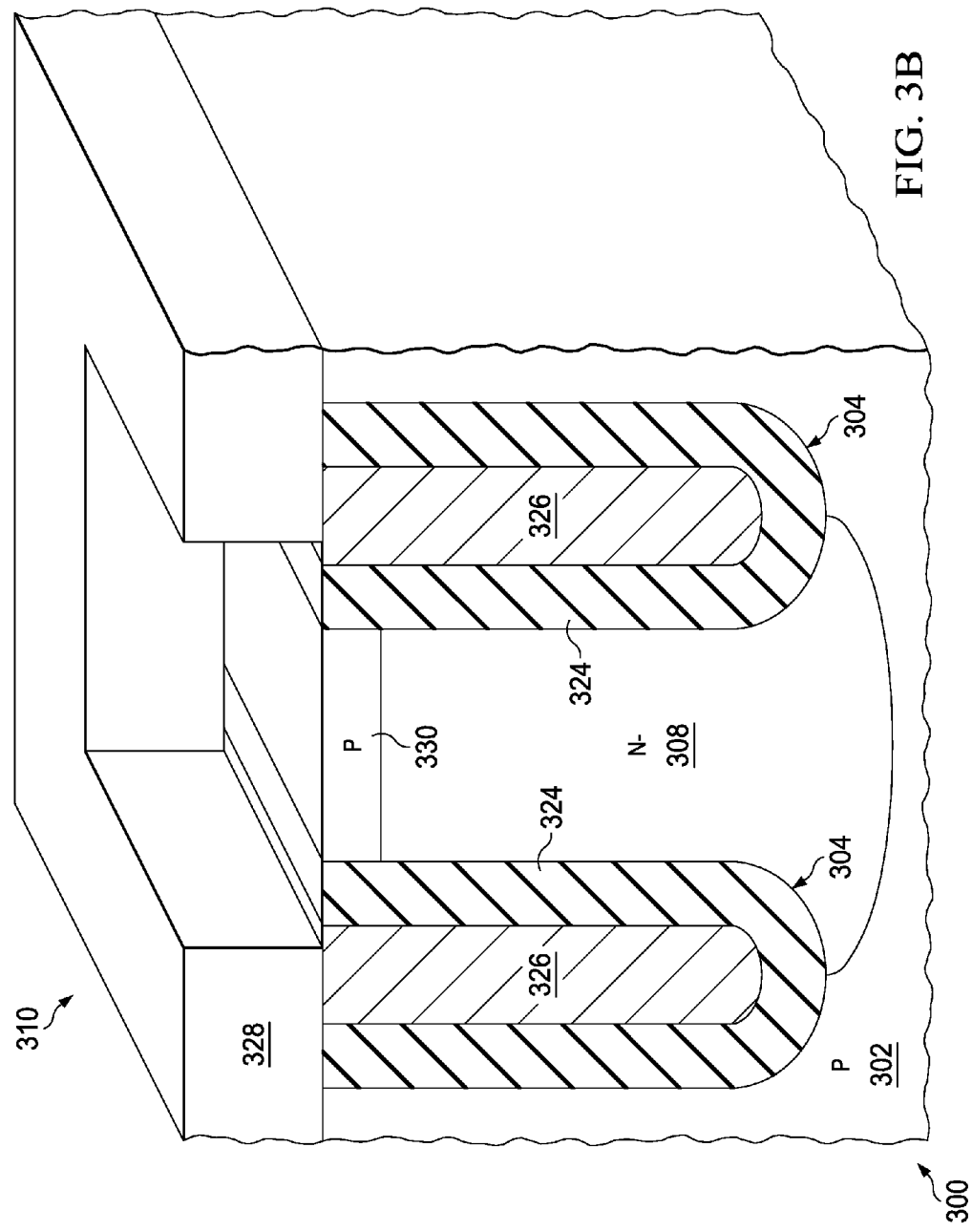

FIG. 3A through FIG. 3G are cross sections of a semiconductor device, for example as depicted in FIG. 1 or FIG. 2, depicted in successive stages of fabrication. Referring to FIG. 3A, the semiconductor device 300 is formed in and on a p-type semiconductor substrate 302. Deep trench structures 304 of a vertical drain extended MOS transistor 310 are formed in the substrate 302 by etching deep isolation trenches in the substrate, forming dielectric liners 324 and subsequently optionally forming electrically conductive central members 326 on the dielectric liners 324. The deep isolation trenches may be formed, for example, by a process stating with forming a layer of hard mask material over the top surface of the substrate 302. A hard mask may be formed by forming an etch mask by a photolithographic followed by removing the hard mask material over regions defined for the deep isolation trenches using a reactive ion etch (RIE) process. After patterning the hard mask, material is removed from the substrate 302 in the deep isolation trenches using an anisotropic etch process, such as a Bosch deep RIE process or a continuous deep RIE process.

The dielectric liners 324 may include, for example, thermally grown silicon dioxide. The dielectric liners 324 may also include one or more layers of dielectric material such as silicon dioxide, silicon nitride and/or silicon oxynitride, formed by a chemical vapor deposition (CVD) process. The electrically conductive central members 326 may include, for example, polycrystalline silicon, commonly referred to as polysilicon, formed by thermally decomposing SiH4 gas inside a low-pressure reactor at a temperature of 580° C. to 650° C. The polysilicon may be doped during formation to provide a desired electrical resistance. The filled deep isolation trenches form the deep trench structures 304. Unwanted dielectric material over the top surface of the substrate 302 from formation of the dielectric liners 324 and unwanted conductive material over the top surface of the substrate 302 from formation of the electrically conductive central members 326 may be removed, for example using an etchback and/or chemical mechanical polish (CMP) process.

The vertical drain extended MOS transistor 310 includes a vertical drain contact region, not shown in FIG. 3A through FIG. 3G, and a vertically oriented drift region 308 formed in the substrate 302. A drain contact ion implant process is performed which implants n-type dopants such as phosphorus into the substrate 302 in an area defined for the vertical drain contact region, to form a drain contact implanted region. A dose of the drain contact ion implant process may be, for example, $1 \times 10^{16}$ cm$^{-2}$ to $3 \times 10^{16}$ cm$^{-2}$. A drift region ion implant process is performed which implants n-type dopants such as phosphorus into the substrate 302 in and over an area defined for the vertically oriented drift region 308, to form drift implanted regions. A dose of the drain contact ion implant process is at least ten times higher than the drift region ion implant dose.

Subsequently, a thermal drive operation is performed which heats the substrate 302 so as to activate and diffuse the implanted dopants in the drain contact implanted region and the drift implanted region thereby form the vertical drain contact region and the vertically oriented drift region 308, respectively. Conditions of the thermal drive operation depend on a depth of the deep trench structures 304 and a desired lateral extent of the vertical drain contact region at the bottoms of the deep trench structures 304. For example, a vertical drain extended MOS transistor 310 with deep trench structures 304 that are 2.5 microns deep may have a thermal drive operation which heats the substrate 302 at 1100° C. for 3.5 to 4 hours, or equivalent anneal conditions, for example, 1125° C. for 2 hours, or 1050° C. for 12 hours.

Subsequently, a body implant mask 328 is formed over the substrate 302 so as to expose an area of the vertically oriented drift region 308 defined for a body region of the vertical drain extended MOS transistor 310. The body implant mask 328 may, for example, comprise primarily photoresist, or may include hard mask material such as silicon nitride. The area exposed by the body implant mask 328 extends over the dielectric liners 324 abutting the area defined for the body region.

Referring to FIG. 3B, a body implant process is performed which implants p-type dopants such as boron into the substrate 302 in the area exposed by the body implant mask 328 to form a body implanted region 330. A dose of the body implant process may be, for example, $1 \times 10^{13}$ cm$^{-2}$ to $5 \times 10^{13}$ cm$^{-2}$.

Figure 3C:
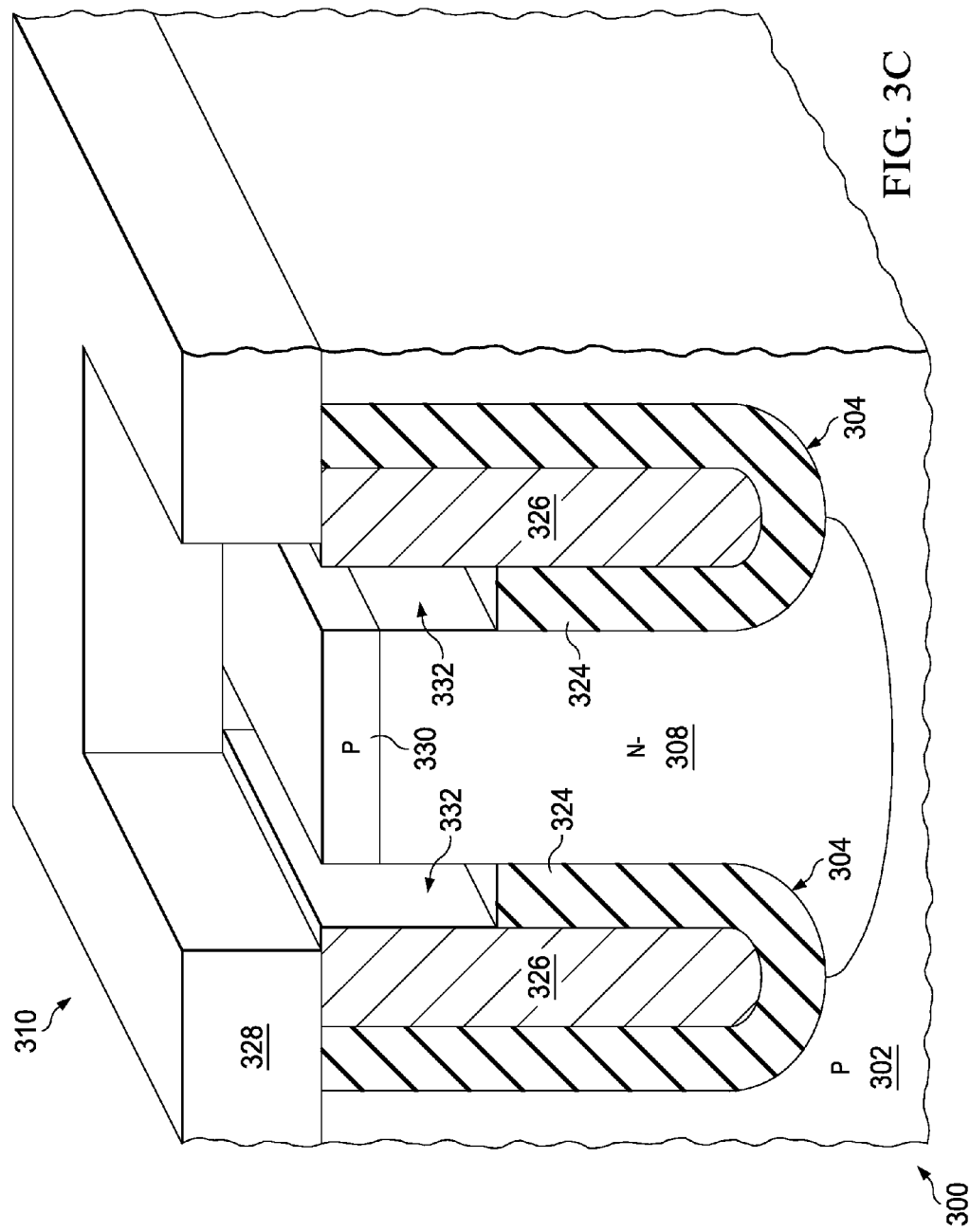

Referring to FIG. 3C, a gate trench etch operation is performed which uses the body implant mask 328 as an etch mask. Dielectric material is removed from the dielectric liners 324 by the gate trench etch operation to form vertically oriented gate trenches 332 adjacent to, and extending below, the body implanted region 330. The gate trench etch operation may be a timed etch. A wet clean operation, for example including a dilute aqueous solution of hydrofluoric acid, may be performed after the gate trench etch operation to remove residue from sides of the vertically oriented gate trenches 332. The body implant mask 328 may be removed after the gate trench etch operation is completed.

Figure 3D:
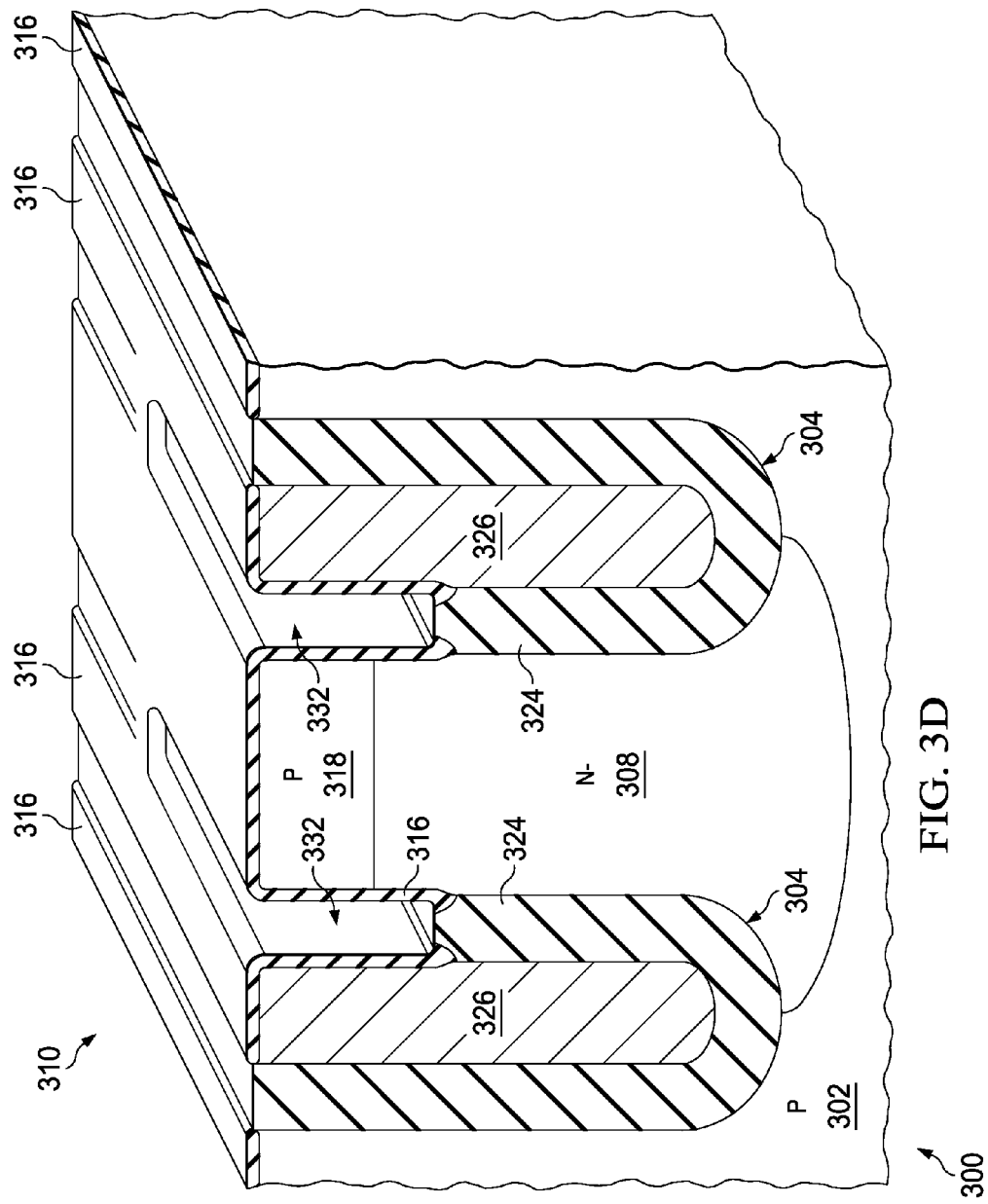

Referring to FIG. 3D, a gate dielectric layer 316 is formed on the substrate 302 in the vertically oriented gate trenches 332 and possibly on other exposed semiconductor surfaces of the substrate 302. The gate dielectric layer 316 may be, for example, one or more layers of silicon dioxide, silicon oxynitride, aluminum oxide, aluminum oxy-nitride, hafnium oxide, hafnium silicate, hafnium silicon oxy-nitride, zirconium oxide, zirconium silicate, and/or zirconium silicon oxynitride. The gate dielectric layer 316 may include nitrogen as a result of exposure to a nitrogen containing plasma or a nitrogen-containing ambient gas at temperatures between 50 C and 800 C. The gate dielectric layer 316 may be formed by any of a variety of gate dielectric formation processes, for example thermal oxidation, plasma nitridation of an oxide layer, and/or dielectric material deposition by atomic layer deposition (ALD). A thickness of the gate dielectric layers 316 may be 2.5 to 3.3 nanometers per volt of gate-source bias on the vertical drain extended MOS transistor 310. For example, an instance of the vertical drain extended MOS transistor 310 operating with 30 volts of gate-source bias may have the gate dielectric layer 316 with a thickness of 75 to 100 nanometers.

Formation of the gate dielectric layer 316 may involve heating the substrate 302 so that the p-type dopants in the body implanted region 330 of FIG. 3C diffuse and become activated to form a p-type body region 318. For example, growing a thermal oxide for the gate dielectric layer 316 may provide a sufficient thermal profile to diffuse the p-type dopants in the body implanted region 330 so that the body region 318 extends to a desired depth in the substrate 302. Alternatively, a thermal process such as an anneal may be performed to provide a desired depth for the body region 318.

Figure 3E:
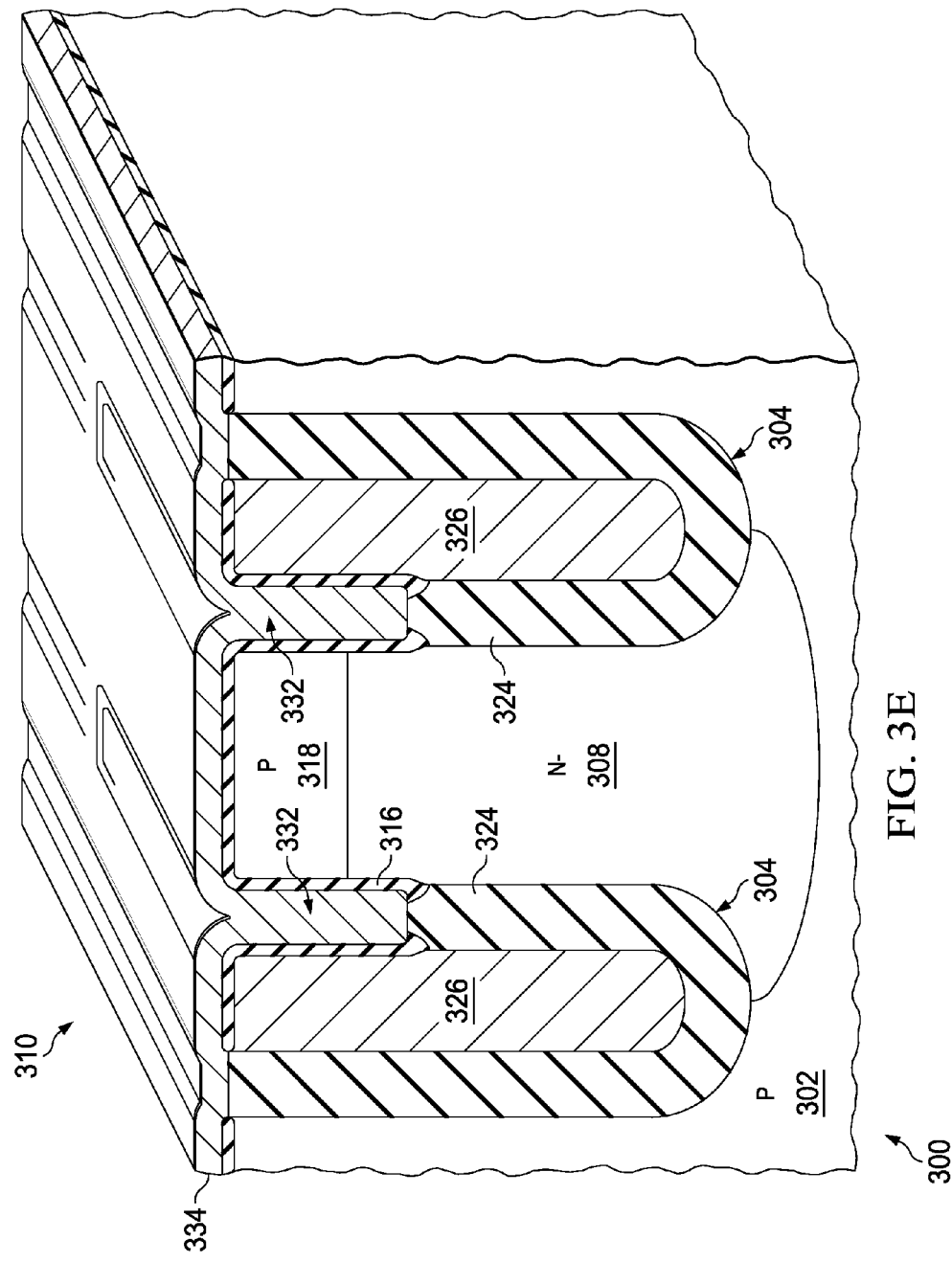

Referring to FIG. 3E, a layer of gate material 334 is formed on the gate dielectric layer 316 in the vertically oriented gate trenches 332, and possibly on other areas of the semiconductor device 300. The layer of gate material 334 may be, for example, polysilicon, or may be one or more layers of other conductive materials such as metal silicide or titanium nitride.

Figure 3F:
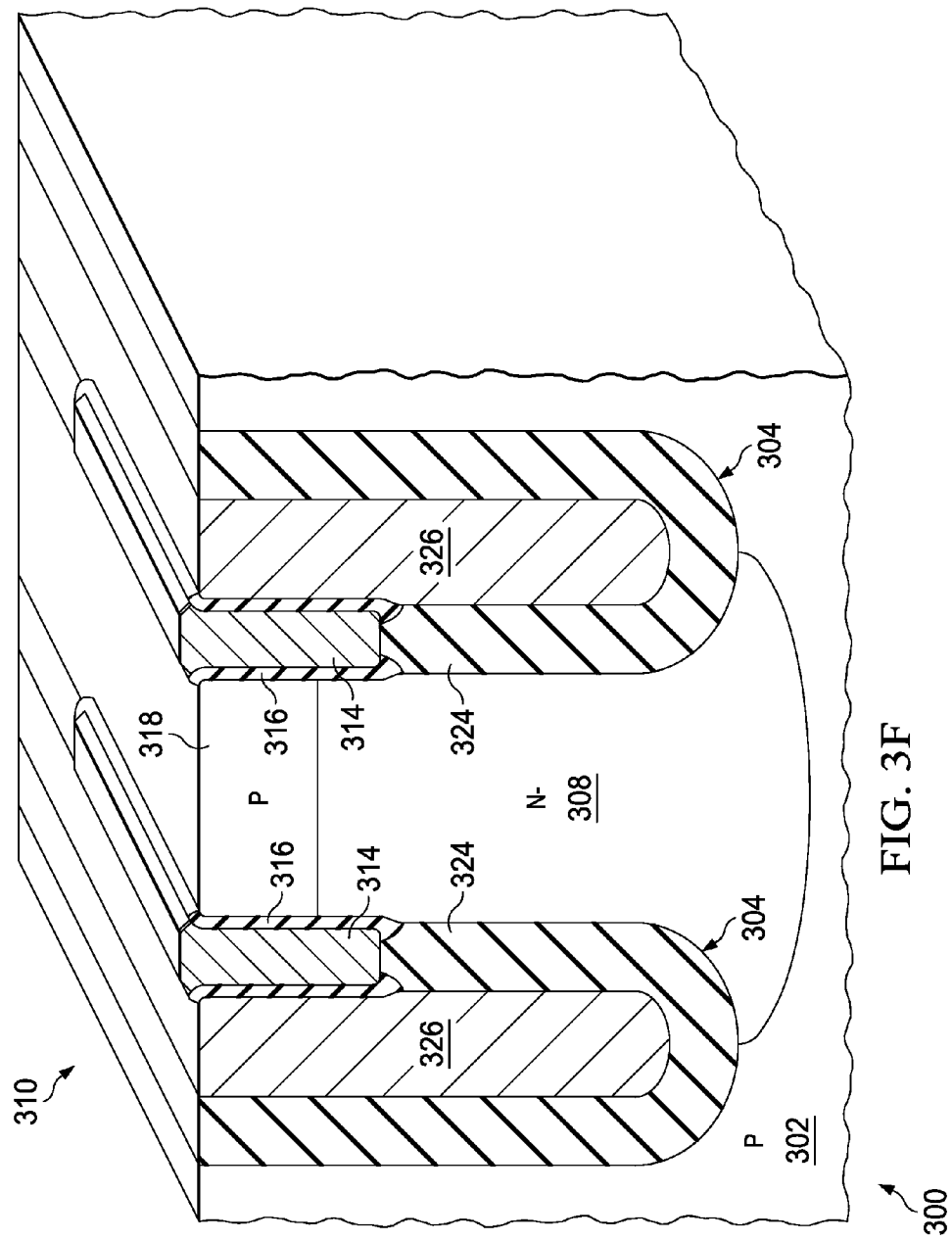

Referring to FIG. 3F, the layer of gate material 334 of FIG. 3E is patterned so as to leave gate material in the vertically oriented gate trenches to form vertical gates 314. The vertical gates 314 extend below the body region 318. In one version of the instant example, the vertical gates 314 may be electrically isolated from the electrically conductive central members 326 by dielectric material.

Figure 3G:
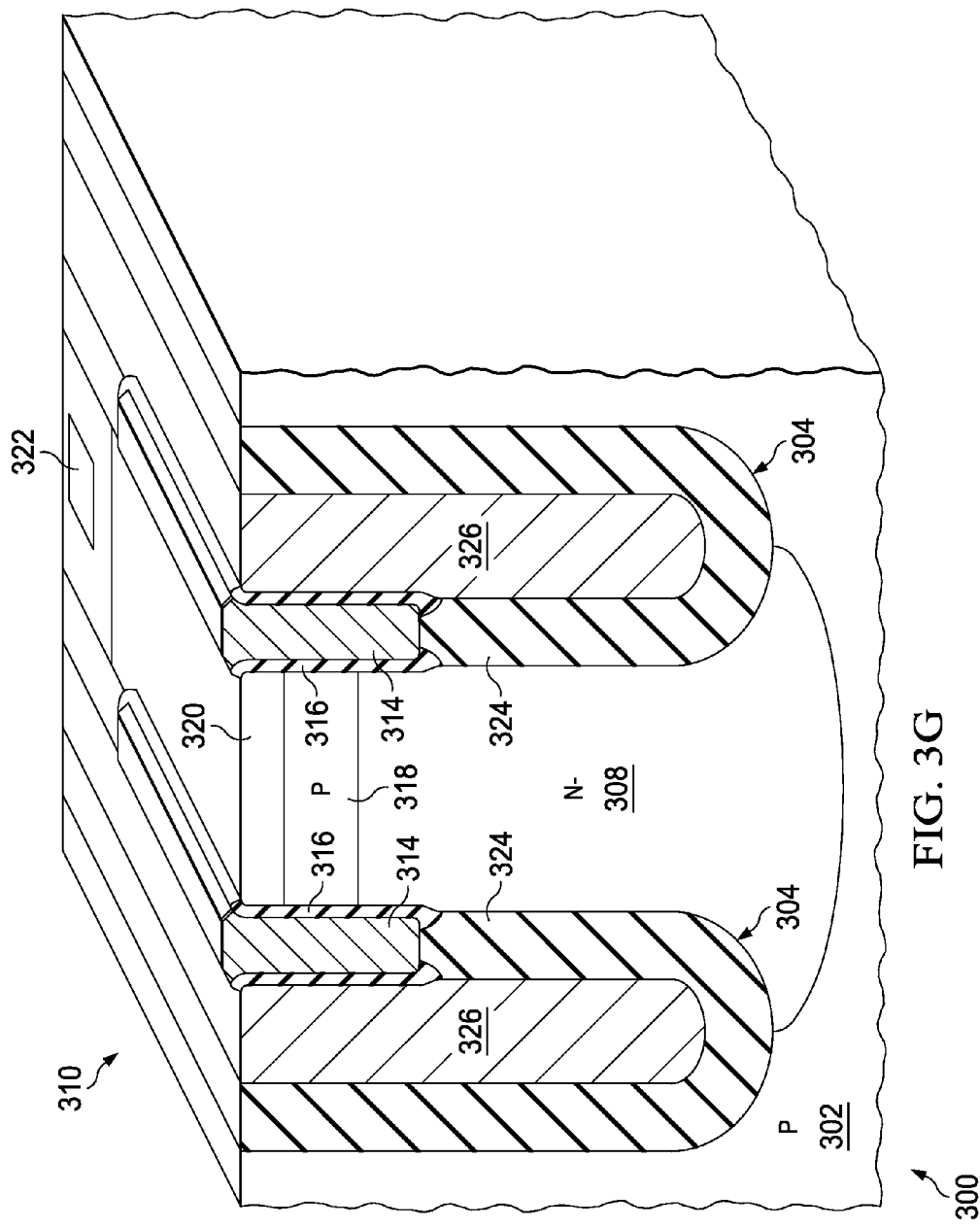

Referring to FIG. 3G, an n-type source region 320 is formed in the substrate 302 adjacent to the gates 314 and abutting the body region 318 opposite from the vertically oriented drift region 308. One or more optional p-type body contact regions 322 may be disposed in the substrate 302 abutting the body region 318.

Figure 4:
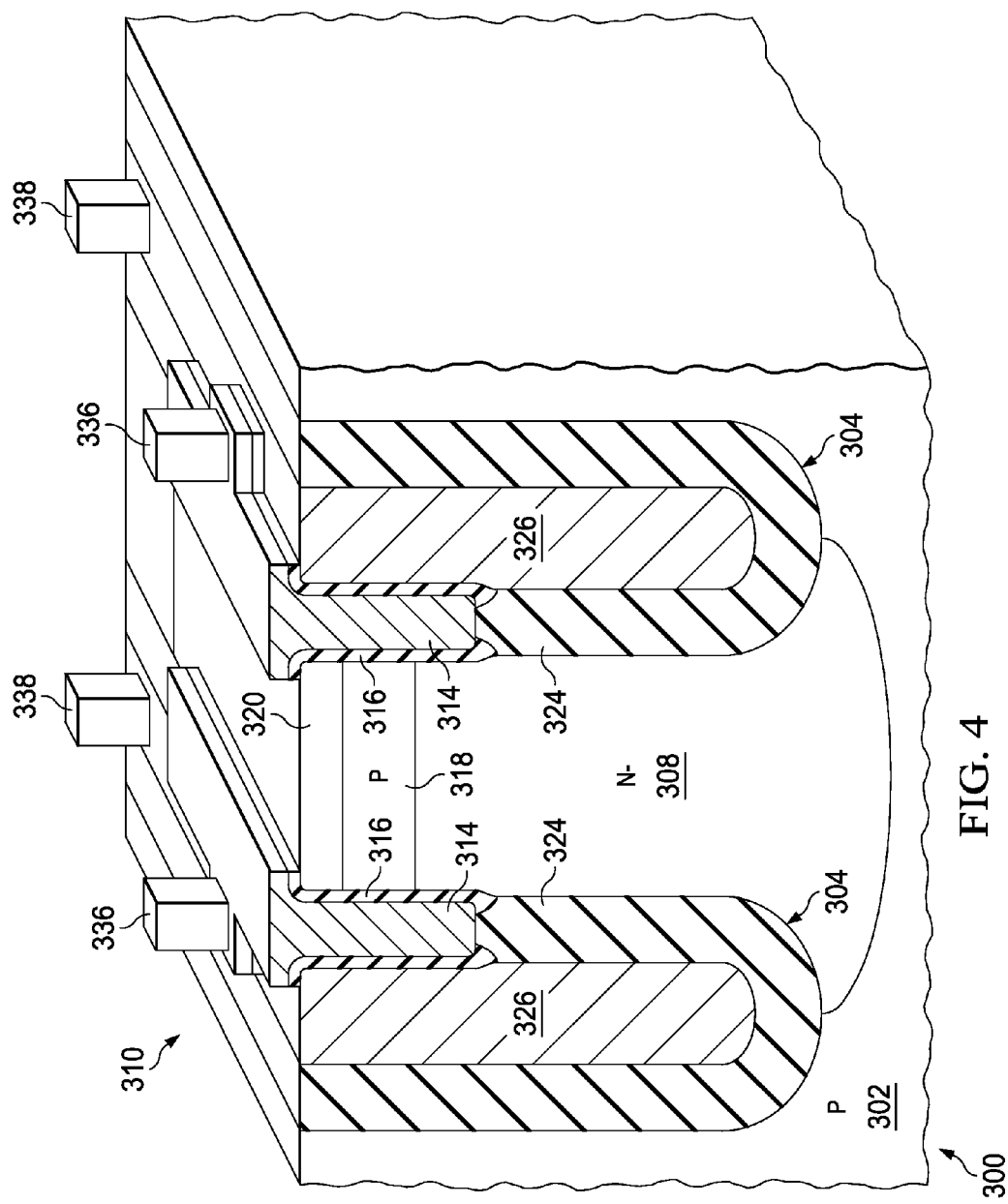
FIG. 4 is a cross section of a semiconductor device depicting exemplary configurations of contacts.

FIG. 4 is a cross section of a semiconductor device depicting exemplary configurations of contacts. The semiconductor device 300 is formed in and on a p-type semiconductor substrate 302. Deep trench structures 304 of a vertical drain extended MOS transistor 310 including dielectric liners 324 and electrically conductive central members 326 are disposed in the substrate 302. An n-type vertically oriented drift region 308 is disposed in the substrate 302 abutted on at least two sides by the deep trench structures 304, which provide RESURF regions for the vertically oriented drift region 308. A p-type body region 318 is disposed in the substrate 302 over the vertically oriented drift region 308. An n-type source region 320 is disposed in the substrate 302 above the body region 318. Vertical gates 314 and gate dielectric layers 316 are disposed in the deep trench structures 304 as described in reference to FIG. 1.

In the instant example, the vertical gates 314 are patterned to overlap the electrically conductive central members 326. The vertical gates 314 may be patterned, for example, using a photolithograpically generated etch mask followed by an RIE process. Gate contacts 336 are formed to make electrical connection to the vertical gates 314 on the overlap areas over the electrically conductive central members 326. Optional contacts 328 may be formed to make electrical connection to the electrically conductive central members 326.

Figure 5:
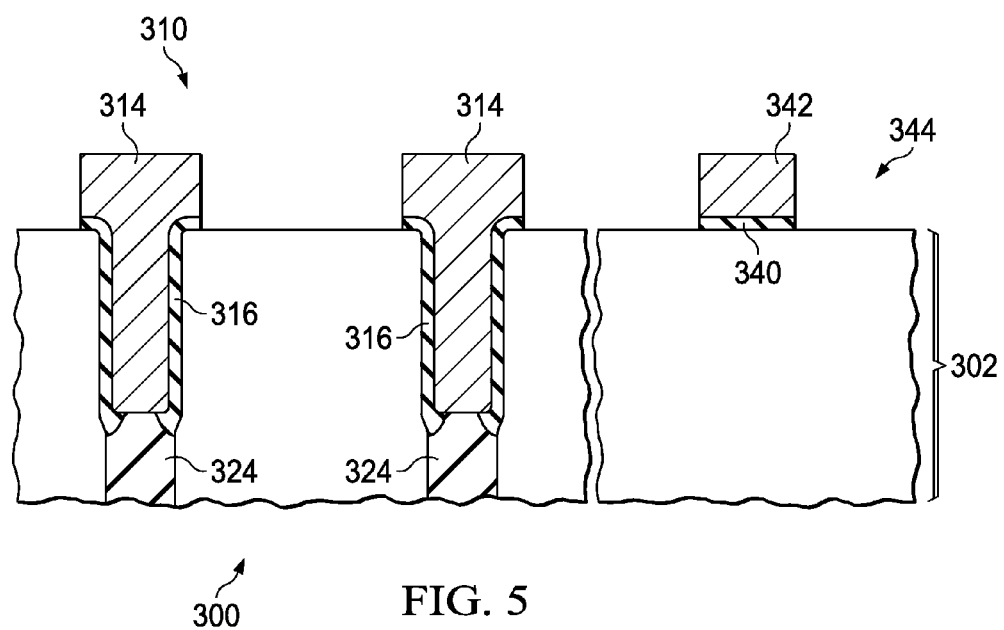
FIG. 5 is a cross section of a semiconductor device containing a vertical drain extended MOS transistor and a planar MOS transistor.

FIG. 5 is a cross section of a semiconductor device containing a vertical drain extended MOS transistor and a planar MOS transistor. The vertical drain extended MOS transistor 310 includes vertical gates 314 and gate dielectric layers 316 are formed in dielectric liners 324 of deep trench structures disposed in a substrate 302 of the semiconductor device 300. The gate dielectric layers 316 and the vertical gates 314 overlap a top surface of the substrate 302, which may simplify fabrication of the trench gates 314. The trench gates 314 may be formed by an RIE process using a photolithograpically defined etch mask. The gate dielectric layers 316 and the trench gates 314 may be formed concurrently with a transistor gate dielectric layer 340 and a transistor gate 342 of a planar MOS transistor 344.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
a substrate comprising a semiconductor having a first conductivity type; and
a vertical drain extended metal oxide semiconductor (MOS) transistor, including:
a plurality of deep trench structures disposed in said substrate, at least one micron deep, each having a dielectric liner abutting said substrate, said deep trench structures having substantially equal depths;
a vertical drain contact region having a second conductivity type opposite from said first conductivity type disposed in said substrate, said vertical drain contact region abutting and being bounded on at least two opposite sides by a portion of said deep trench structures;
a vertically oriented drift region having said second conductivity type disposed in said substrate, abutting and being bounded on at least two opposite sides by a portion of said deep trench structures, in which said vertically oriented drift region makes electrical connection to said vertical drain contact region proximate to a bottom of a first deep trench structure of said plurality of said deep trench structures, said first deep trench structure separating said vertically oriented drift region from said vertical drain contact region;
a vertical gate on a gate dielectric layer disposed in a vertically oriented gate trench in said dielectric liner of a first deep trench structure of said plurality of deep trench structures; and
a body region having said first conductivity type disposed over said vertically oriented drift region and contacting said gate dielectric layer, such that said vertical gate extends below said body region.

2. The semiconductor device of claim 1, in which said vertical gate does not extend laterally into a curved portion of said dielectric liner.

3. The semiconductor device of claim 1, in which said vertical gate extends laterally into a curved portion of said dielectric liner.

4. The semiconductor device of claim 1, in which:
said vertically oriented drift region is a first vertically oriented drift region;
said vertical gate is a first vertical gate;
said gate dielectric layer is a first gate dielectric layer;
said vertically oriented gate trench is a first vertically oriented gate trench; and
said vertical drain extended MOS transistor further includes a second vertically oriented drift region separated from said first vertically oriented drift region by a first deep trench structure of said plurality of said deep trench structures, with a second vertical gate on a second gate dielectric layer disposed in a second vertically oriented gate trench in said dielectric liner of said first deep trench structure.

5. The semiconductor device of claim 1, in which said deep trench structure is 2.5 microns to 5 microns deep.

6. The semiconductor device of claim 1, in which:
said first conductivity type is p-type; and
said second conductivity type is n-type.

7. A semiconductor device, comprising:
a substrate comprising a semiconductor having a first conductivity type; and
a vertical drain extended metal oxide semiconductor (MOS) transistor, including:
a plurality of deep trench structures disposed in said substrate, at least one micron deep, each having a dielectric liner abutting said substrate, said deep trench structures having substantially equal depths;
a vertical drain contact region having a second conductivity type opposite from said first conductivity type disposed in said substrate, said vertical drain contact region abutting and being bounded on at least two opposite sides by a portion of said deep trench structures;
a vertically oriented drift region having said second conductivity type disposed in said substrate, abutting and being bounded on at least two opposite sides by a portion of said deep trench structures;
a vertical gate on a gate dielectric layer disposed in a vertically oriented gate trench in said dielectric liner of a first deep trench structure of said plurality of deep trench structures; and
a body region having said first conductivity type disposed over said vertically oriented drift region and contacting said gate dielectric layer, such that said vertical gate extends below said body region, in which said vertical drain extended MOS transistor further includes a buried layer having said second conductivity type disposed in said substrate, extending under said vertically oriented drift region and making electrical connection to said vertical drain contact region.

8. The semiconductor device of claim 7, in which said vertical gate does not extend laterally into a curved portion of said dielectric liner.

9. The semiconductor device of claim 7, in which said vertical gate extends laterally into a curved portion of said dielectric liner.

10. The semiconductor device of claim 7, in which said deep trench structure is 2.5 microns to 5 microns deep.

11. The semiconductor device of claim 7, in which:
said first conductivity type is p-type; and
said second conductivity type is n-type.

12. A semiconductor device, comprising:
a substrate comprising a semiconductor having a first conductivity type; and
a vertical drain extended metal oxide semiconductor (MOS) transistor, including:

a plurality of deep trench structures disposed in said substrate, at least one micron deep, each having a dielectric liner abutting said substrate, said deep trench structures having substantially equal depths;

a vertical drain contact region having a second conductivity type opposite from said first conductivity type disposed in said substrate, said vertical drain contact region abutting and being bounded on at least two opposite sides by a portion of said deep trench structures;

a vertically oriented drift region having said second conductivity type disposed in said substrate, abutting and being bounded on at least two opposite sides by a portion of said deep trench structures;

a vertical gate on a gate dielectric layer disposed in a vertically oriented gate trench in said dielectric liner of a first deep trench structure of said plurality of deep trench structures; and a body region having said first conductivity type disposed over said vertically oriented drift region and contacting said gate dielectric layer, such that said vertical gate extends below said body region, in which said vertically oriented drift region is laterally surrounded by a first deep trench structure of said plurality of said deep trench structures, said first deep trench structure having a closed loop configuration.

13. The semiconductor device of claim 12, in which said vertical gate laterally surrounds said vertically oriented drift region.

14. The semiconductor device of claim 12, in which said vertical gate does not extend laterally into a curved portion of said dielectric liner.

15. The semiconductor device of claim 12, in which said vertical gate extends laterally into a curved portion of said dielectric liner.

16. The semiconductor device of claim 12, in which said deep trench structure is 2.5 microns to 5 microns deep.

17. The semiconductor device of claim 12, in which:
said first conductivity type is p-type; and
said second conductivity type is n-type.

* * * * *